(12) United States Patent
Kim et al.

(10) Patent No.: US 12,101,565 B2
(45) Date of Patent: Sep. 24, 2024

(54) ELECTRONIC DEVICE AND METHOD FOR OBTAINING AN AMOUNT OF LIGHT

(71) Applicant: SAMSUNG ELECTRONICS CO., LTD., Suwon-si (KR)

(72) Inventors: Eunho Kim, Suwon-si (KR); Jaehyoung Park, Suwon-si (KR); Jeongwon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 221 days.

(21) Appl. No.: 17/888,124

(22) Filed: Aug. 15, 2022

(65) Prior Publication Data
US 2022/0394175 A1    Dec. 8, 2022

Related U.S. Application Data

(63) Continuation of application No. PCT/KR2021/017432, filed on Nov. 24, 2021.

(30) Foreign Application Priority Data

Nov. 25, 2020 (KR) .......................... 10-2020-0160245

(51) Int. Cl.
H04N 23/80 (2023.01)
H04N 23/52 (2023.01)
H04N 23/56 (2023.01)

(52) U.S. Cl.
CPC ............. *H04N 23/80* (2023.01); *H04N 23/52* (2023.01); *H04N 23/56* (2023.01)

(58) Field of Classification Search
CPC ........ H04N 23/80; H04N 23/52; H04N 23/56; H04N 23/71; H04N 23/57; G03B 30/00; H05K 9/00
See application file for complete search history.

(56) References Cited

U.S. PATENT DOCUMENTS 7,764,319 B2    7/2010  Fukumoto
10,389,951 B2   8/2019  Park et al.
(Continued)

FOREIGN PATENT DOCUMENTS

CN    111129102 A    5/2020
JP    2002-176653 A   6/2002
(Continued)

OTHER PUBLICATIONS

International Search Report (PCT/ISA/210) issued Mar. 15, 2022 y the International Searching Authority in counterpart International Application No. PCT/KR2021/017432.
(Continued)

*Primary Examiner* — Abdelaaziz Tissire
(74) *Attorney, Agent, or Firm* — Sughrue Mion, PLLC

(57) ABSTRACT

In an electronic device according to an embodiment of the present disclosure, the electronic device may include a memory, a display which includes a pixel layer including a plurality of pixels and a shielding structure with a hole formed disposed below the pixel layer, a camera module disposed below the shielding structure, and a processor operatively coupled with the camera module and the memory, and the processor may obtain a light source image through the camera module, obtain a first data based on a first length value corresponding to a first region and a second length value corresponding to a second region in the obtained light source image, compare the first data with second data stored in the memory, obtain actual light amount
(Continued)

data corresponding to the light source based on a result of the comparison, and improve the image based on the actual light amount data.

20 Claims, 12 Drawing Sheets

(56) References Cited

U.S. PATENT DOCUMENTS

| | | | |
|---|---|---|---|
| 11,271,053 B2 | 3/2022 | Liang et al. | |
| 2012/0287307 A1 | 11/2012 | Oyama | |
| 2013/0021498 A1* | 1/2013 | Murasawa | G06T 5/70 |
| | | | 348/222.1 |
| 2016/0042531 A1 | 2/2016 | Nolan et al. | |
| 2018/0098001 A1* | 4/2018 | Park | H04N 23/743 |
| 2020/0213581 A1* | 7/2020 | Lu | G06T 7/0004 |
| 2020/0249731 A1 | 8/2020 | Chun et al. | |
| 2021/0199952 A1* | 7/2021 | Cho | H04N 7/144 |
| 2022/0036511 A1 | 2/2022 | Pan et al. | |
| 2022/0036526 A1* | 2/2022 | Luo | G06T 5/70 |
| 2022/0159188 A1 | 5/2022 | Lee et al. | |
| 2022/0210369 A1 | 6/2022 | Wan et al. | |
| 2022/0352284 A1 | 11/2022 | Helander et al. | |
| 2022/0365389 A1* | 11/2022 | Aoki | G02F 1/133512 |
| 2023/0102607 A1* | 3/2023 | Nakata | H04N 23/76 |
| | | | 348/223.1 |

FOREIGN PATENT DOCUMENTS

| | | | |
|---|---|---|---|
| JP | 5000030 B1 | 8/2012 | |
| JP | 2015-32878 A | 2/2015 | |
| JP | 2016-91376 A | 5/2016 | |
| JP | 2016-524265 A | 8/2016 | |
| KR | 10-2020-0095959 A | 8/2020 | |
| KR | 10-2020-0101800 A | 8/2020 | |
| KR | 10-2021-0141565 A | 11/2021 | |
| KR | 10-2022-0015915 A | 2/2022 | |
| KR | 10-2022-0029310 A | 3/2022 | |
| KR | 10-2022-0046551 A | 4/2022 | |

OTHER PUBLICATIONS

Written Opinion (PCT/ISA/237) issued Mar. 15, 2022 y the International Searching Authority in counterpart International Application No. PCT/KR2021/017432.

Communication issued on Mar. 6, 2024 by the European Patent Office for European Patent Application No. 21898615.6.

* cited by examiner

ELECTRONIC DEVICE AND METHOD FOR OBTAINING AN AMOUNT OF LIGHT

CROSS REFERENCE TO RELATED APPLICATIONS

This application is a bypass continuation of international application PCT/KR2021/017432 filed on Nov. 24, 2021 in the Korean Intellectual Property Office (KIPO) and claims benefit of Korean Patent Appln. No. 10-2020-0160245 filed on Nov. 25, 2020 in KIPO; the contents of the above are incorporated herein by reference.

TECHNICAL FIELD

Various embodiments of the present disclosure relate to an electronic device for obtaining an amount of light.

BACKGROUND ART

If acquiring an image through a camera of an electronic device, an image sensor included in the camera may perform a task of acquiring the image using incident light by a light source. However, due to limit of a pixel dynamic range of the image sensor, it is necessary to control to an appropriate level if an incident light amount by the light source is excessive.

As relevant techniques, there is a technique for estimating a light source saturation level using a plurality of images having different exposures. In addition, there are a technique for detecting an image quality degradation component such as flare resulting from a corresponding optical element in a device having an optical system including a diffraction optical element and intentionally adjusting and correcting luminance, and a technique for detecting adequate pixel defect by considering pixel characteristics.

Technical Problem

If a plurality of images is used to control a saturation level of a light source, a difficulty that a real-time operation and a frame rate are constrained may arise.

Cost may increase if a separate sensor is mounted to measure the saturation level of the light source.

According to various embodiments of the present disclosure, an electronic device for obtaining an actual amount of light even though a pixel is saturated by a light source may be provided.

Solution to Problem

According to various embodiments of the present disclosure, an electronic device for obtaining an actual amount of light even though a pixel is saturated by a light source is provided. The actual amount of light is used to improve an image.

SUMMARY

Provided herein is an electronic device including a memory; a display including a pixel layer including a plurality of pixels, and a shielding structure with a hole formed disposed below the pixel layer; a camera module disposed below the shielding structure; and a processor operatively coupled with the camera module and the memory, wherein the processor is configured to: obtain a light source image through the camera module, obtain first data based on a first length value corresponding to a first region and a second length value corresponding to a second region in the light source image, perform a comparison of the first data with second data stored in the memory, obtain actual light amount data corresponding to a light source based on a result of the comparison, wherein the light source is associated with the light source image, and improve a final image using the actual light amount data.

Also provided herein is a method of an electronic device, the method including obtaining a light source image through a camera module disposed below a shielding structure; obtaining a first data based on a first length value corresponding to a first region and a second length value corresponding to a second region in the light source image; performing a comparison of the first data with second data stored in a memory; obtaining actual light amount data corresponding to a light source based on a result of the comparison, wherein the light source is associated with the light source image; and improving a final image using the actual light amount data.

Also provided herein is an electronic device including: a memory; a camera hole including a shielding structure which has a particular shape; a camera module disposed below the camera hole; and a processor operatively coupled with the camera module and the memory, wherein the processor is configured to: obtain a light source image through the camera module, obtain first data based on a first length value corresponding to a first region and a second length value corresponding to a second region in the light source image, perform a comparison of the first data with second data stored in the memory, obtain actual light amount data corresponding to a light source based on a result of the comparison, wherein the light source is associated with the light source image, improve a final image using the actual light amount data.

Advantageous Effects

According to various embodiments of the present disclosure, a saturation level of a light source may be measured using one image without using a plurality of images.

According to various embodiments of the present disclosure, there is no need to mount a separate sensor to measure a saturation level of a light source, which may be advantageous in terms of cost.

Effects obtainable based on various embodiments are not limited to the above-mentioned effects, and other effects which are not mentioned may be clearly understood by those skilled in the art of the present disclosure through the following descriptions.

BRIEF DESCRIPTION OF DRAWINGS

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

Figure 1:
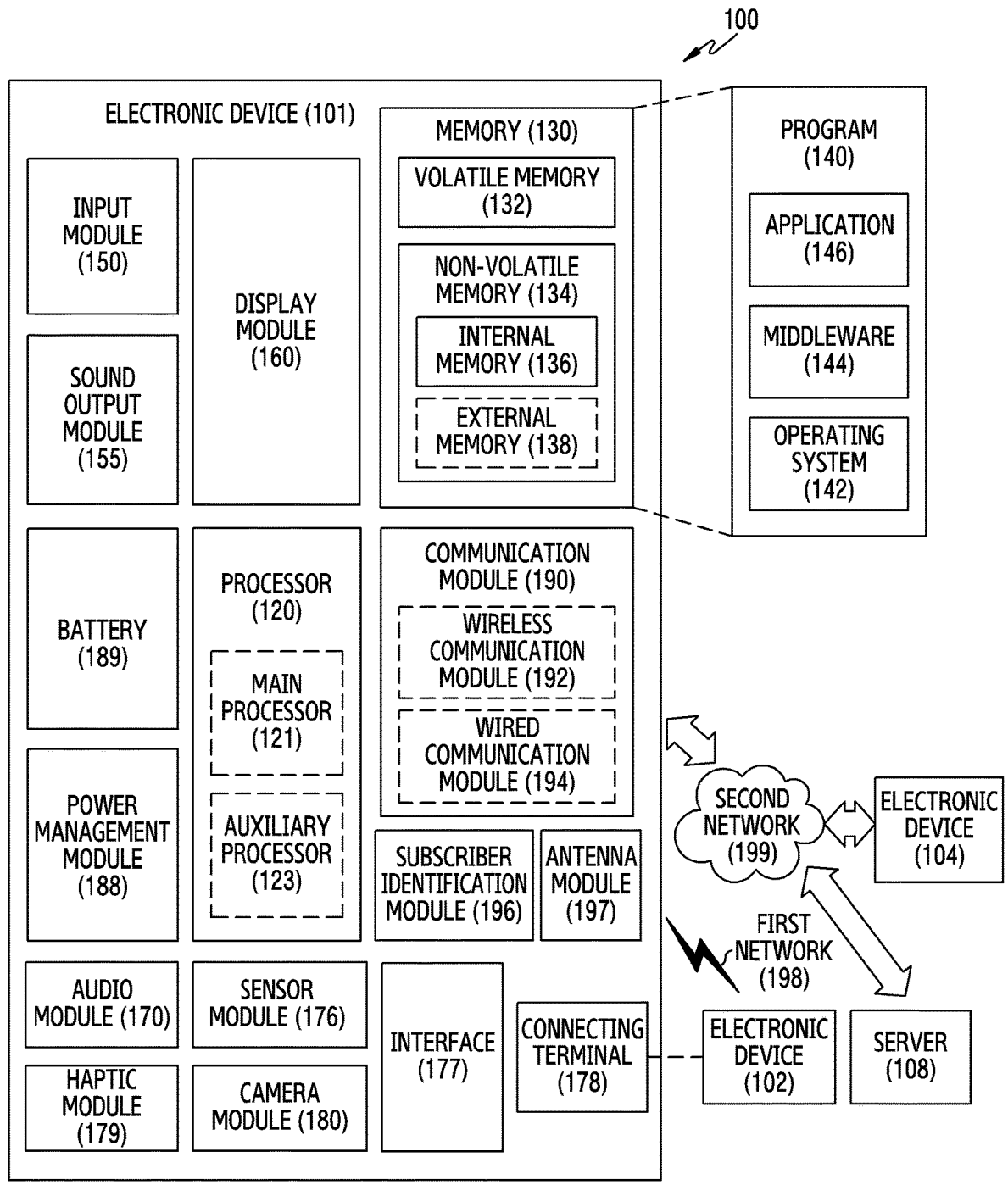
FIG. 1 is a block diagram of an electronic device in a network environment, according to an embodiment.

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
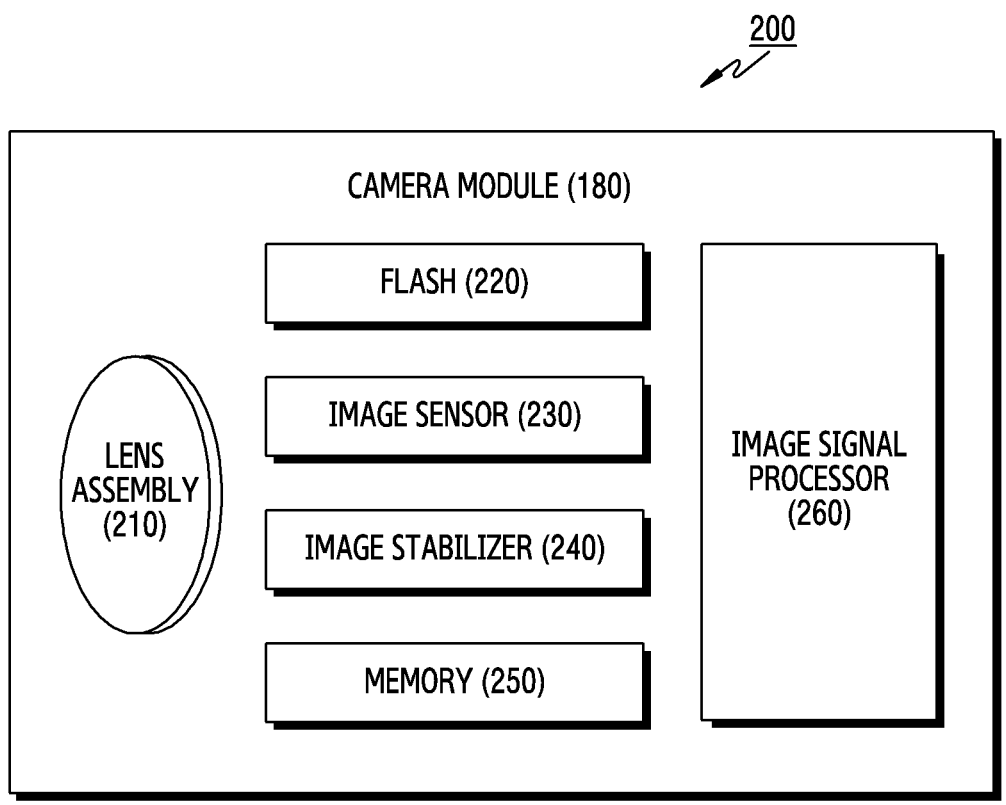
FIG. 2 is a block diagram illustrating a camera module, according to an embodiment.

FIG. 2 is a block diagram 200 illustrating the camera module 180 according to various embodiments. Referring to FIG. 2, the camera module 180 may include a lens assembly 210, a flash 220, an image sensor 230, an image stabilizer 240, memory 250 (e.g., buffer memory), or an image signal processor 260. The lens assembly 210 may collect light emitted or reflected from an object whose image is to be taken. The lens assembly 210 may include one or more lenses. According to an embodiment, the camera module 180 may include a plurality of lens assemblies 210. In such a case, the camera module 180 may form, for example, a dual camera, a 360-degree camera, or a spherical camera. Some of the plurality of lens assemblies 210 may have the same lens attribute (e.g., view angle, focal length, auto-focusing, f number, or optical zoom), or at least one lens assembly may have one or more lens attributes different from those of another lens assembly. The lens assembly 210 may include, for example, a wide-angle lens or a telephoto lens.

The flash 220 may emit light that is used to reinforce light reflected from an object. According to an embodiment, the flash 220 may include one or more light emitting diodes (LEDs) (e.g., a red-green-blue (RGB) LED, a white LED, an infrared (IR) LED, or an ultraviolet (UV) LED) or a xenon lamp. The image sensor 230 may obtain an image corresponding to an object by converting light emitted or reflected from the object and transmitted via the lens assembly 210 into an electrical signal. According to an embodiment, the image sensor 230 may include one selected from image sensors having different attributes, such as a RGB sensor, a black-and-white (BW) sensor, an IR sensor, or a UV sensor, a plurality of image sensors having the same attribute, or a plurality of image sensors having different attributes. Each image sensor included in the image sensor 230 may be implemented using, for example, a charged coupled device (CCD) sensor or a complementary metal oxide semiconductor (CMOS) sensor.

The image stabilizer 240 may move the image sensor 230 or at least one lens included in the lens assembly 210 in a particular direction, or control an operational attribute (e.g., adjust the read-out timing) of the image sensor 230 in response to the movement of the camera module 180 or the electronic device 101 including the camera module 180. This allows compensating for at least part of a negative effect (e.g., image blurring) by the movement on an image being captured. According to an embodiment, the image stabilizer 240 may sense such a movement by the camera module 180 or the electronic device 101 using a gyro sensor (not shown) or an acceleration sensor (not shown) disposed inside or outside the camera module 180. According to an embodiment, the image stabilizer 240 may be implemented, for example, as an optical image stabilizer.

The memory 250 may store, at least temporarily, at least part of an image obtained via the image sensor 230 for a subsequent image processing task. For example, if image capturing is delayed due to shutter lag or multiple images are quickly captured, a raw image obtained (e.g., a Bayer-patterned image, a high-resolution image) may be stored in the memory 250, and its corresponding copy image (e.g., a low-resolution image) may be previewed via the display device 160. Thereafter, if a specified condition is met (e.g., by a user's input or system command), at least part of the raw image stored in the memory 250 may be obtained and processed, for example, by the image signal processor 260. According to an embodiment, the memory 250 may be configured as at least part of the memory 130 or as a separate memory that is operated independently from the memory 130.

The image signal processor 260 may perform one or more image processing with respect to an image obtained via the image sensor 230 or an image stored in the memory 250. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 260 may perform control (e.g., exposure time control or read-out timing control) with respect to at least one (e.g., the image sensor 230) of the components included in the camera module 180. An image processed by the image signal processor 260 may be stored back in the memory 250 for further processing, or may be provided to an external component (e.g., the memory 130, the display device 160, the electronic device 102, the electronic device 104, or the server 108) outside the camera module 180. According to an embodiment, the image signal processor 260 may be configured as at least part of the processor 120, or as a separate processor that is operated independently from the processor 120. If the image signal processor 260 is configured as a separate processor from the processor 120, at least one image processed by the image signal processor 260 may be displayed, by the processor 120, via the display device 160 as it is or after being further processed.

According to an embodiment, the electronic device 101 may include a plurality of camera modules 180 having different attributes or functions. In such a case, at least one of the plurality of camera modules 180 may form, for example, a wide-angle camera and at least another of the plurality of camera modules 180 may form a telephoto camera. Similarly, at least one of the plurality of camera modules 180 may form, for example, a front camera and at least another of the plurality of camera modules 180 may form a rear camera.

Figure 3:
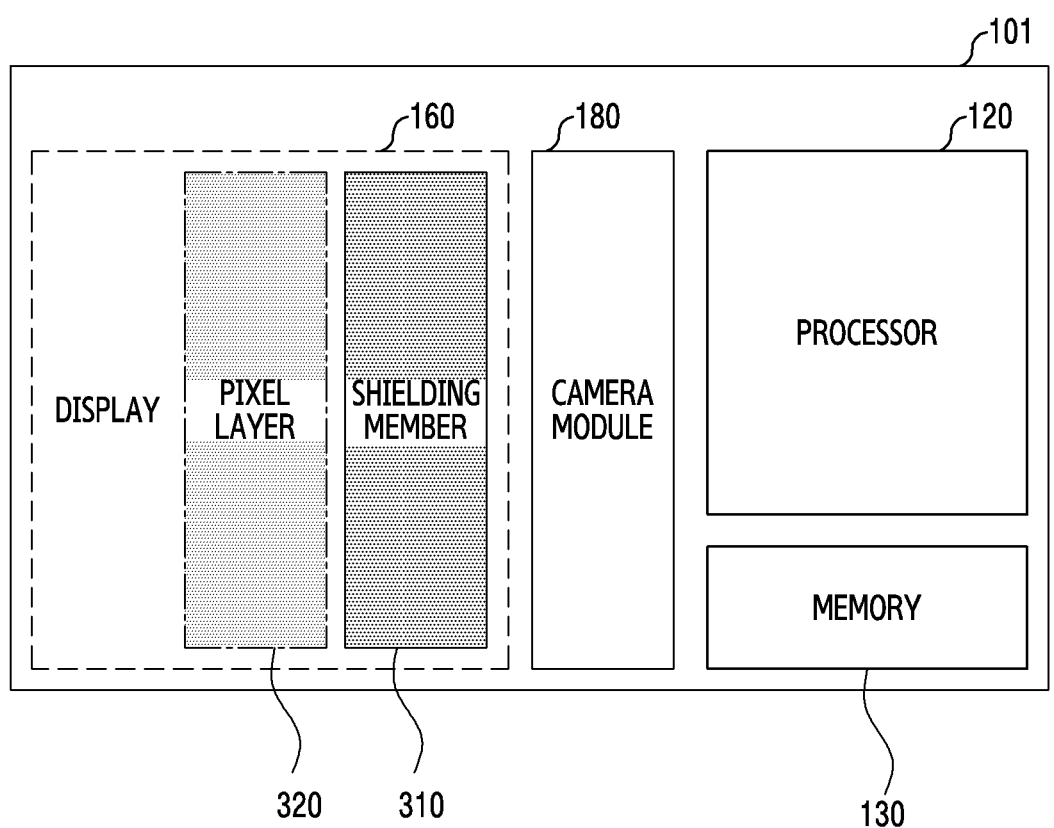
FIG. 3 is a diagram briefly illustrating a configuration of an electronic device, according to an embodiment.

FIG. 3 briefly illustrates a configuration of an electronic device 101, according to an embodiment. The electronic device 101 shown in FIG. 3 may be similar to at least part of the electronic device 101 shown in FIG. 1 and FIG. 2 or may include another embodiment.

In an embodiment, the electronic device 101 may include at least one of a processor 120, a memory 130, and a camera module 180.

In an embodiment, the electronic device 101 may further include a display 160.

In an embodiment, the processor 120 may be operatively connected with the memory 130, the display 160, and the camera module 180. For example, the processor 120 may control the memory 130, the display 160, and the camera module 180.

In an embodiment, the memory 130 may store data related to operations of the electronic device 101. For example, the memory 130 may store data relate to an image acquired using the camera module 180. As another example, the memory 130 may store data related to a light source acquired using the camera module 180.

In an embodiment, the display 160 may visually provide data to outside of the electronic device 101. For example, the processor 120 of the electronic device 101 may visually provide image data acquired through the camera module 180 to an external user using the display 160.

In an embodiment, the display 160 may include a pixel layer 320. For example, the display 160 may visually provide the image data including color data to the external user using the pixel layer 320.

In an embodiment, the display 160 may include a shielding structure 310. For example, the display 160 may include the shielding structure 310 of a shape corresponding to a shape of the pixel layer 320.

In an embodiment, the camera module 180 may include the lens assembly 210, the flash 220, the image sensor 230, the image stabilizer 240, the memory 250, and the image signal processor 260, as described in FIG. 2.

In an embodiment, the camera module 180 may be disposed below the shielding structure 310. For example, the camera module 180 may be disposed below the shielding structure 310 included in the display 160. As another example, the camera module 180 may be disposed below the shielding structure 310 even if the display 160 is not necessarily included in the electronic device 101.

According to an embodiment, the camera module 180 may be disposed to detect an external environment through the display 160. For example, the camera module 180 may be disposed to contact with the external environment through an opening or a transmission region formed in the display 160, in a space inside the electronic device 101. According to an embodiment, a region facing the camera module 180 in a region of the display 160 is a part of a region for displaying content, and may be formed as the transmissive region having designated transmittance. A transmissive region is region with some non-zero transmissivity. According to an embodiment, the transmissive region may be formed to have the transmittance ranging from about 5% to about 20%. For example, the transmissive region may include a region through which light for forming an image by being imaged by the image sensor 230 passes, and overlapping an effective region (eg, angle of view region) of some camera modules 180. For example, the transmissive region of the display 160 may include a region having lower pixel density and/or wiring density than periphery. For example, the transmissive region may replace the aforementioned opening. For example, some camera module 180 may include an under display camera (UDC).

Figure 4A:
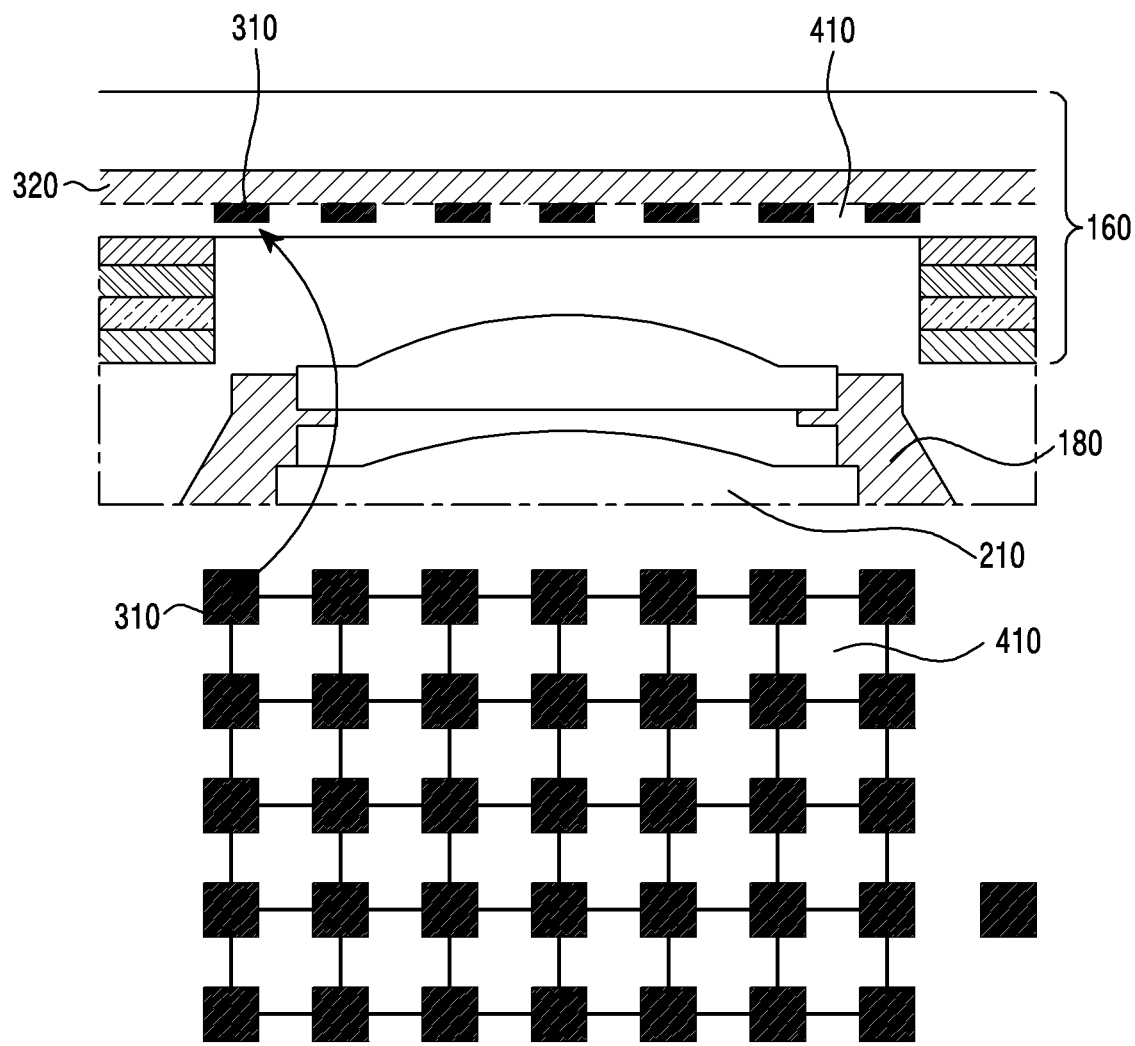
FIG. 4A is a diagram illustrating a shielding structure included in an electronic device, according to an embodiment.

FIG. 4A is a diagram illustrating a shielding structure included in an electronic device, according to an embodiment. FIG. 4A illustrates the shielding structure 310 disposed in the electronic device 101 including the display 160, but the electronic device 101 may include the identical or similar shielding structure 310 even if the display 160 is not included.

In an embodiment, the display 160 may dispose the pixel layer 320 in a region corresponding to a screen display region to visually provide the image data to the user. For example, the electronic device 101 may visually provide the image data to the user through a screen of the display 160 of the region corresponding to the pixel layer 320.

In an embodiment, the shielding structure 310 may be disposed below the pixel layer 320. In an embodiment, the shielding structure 310 may have a shape and/or a pattern corresponding to a shape and/or a pattern of the pixel layer 320. For example, the pixel layer 320 may have a pattern which repeats a square pixel and a hole 410 between pixels. In this case, the shielding structure 310 may have a structure having the pattern which repeats the square and the hole 410 in the same manner. In addition, a position of the hole 410 of the shielding structure 310 may be formed at a position corresponding to a position of the hole 410 of the pixel layer 320. For example, the shielding structure 310 and the pixel layer 320 may be formed to share the hole 410.

In an embodiment, the shielding structure 310 may form the pattern in a region which removes at least part of some layer (e.g., a protection layer, or a shielding layer) of the display 160 for the arrangement of the camera module 180. In an embodiment, the shielding structure 310 may be a structure in which a hole (e.g., the hole 410) is formed in some layer (e.g., a protection layer, or a shielding layer) of the display 160. In an embodiment, the shielding structure 310 may be formed to include a hole (e.g., the hole 410). In an embodiment, the shielding structure 310 may be a metallic material, and formed below the pixel layer 320 in a deposition and/or patterning manner. The shielding structure 310 may protect pixels, and block light emanating from the pixels. According to an embodiment, the shielding structure 310 may include a designated pattern (black matrix) for reducing diffraction of light entering the shielding structure 310, or an opaque metal layer (e.g., a buffer layer, a bottom metal layer (BML)) including designated patterns.

In an embodiment, the camera module 180 may be disposed below the shielding structure 310. For example, the camera module 180 may be disposed below the shielding structure 310 included in the display 160 (see an example of this configuration in FIG. 4B). As another example, if the display 160 is not disposed, the lens assembly 210 of the camera module 180 may be disposed below the shielding structure 310 disposed in one region of a camera hole (not show) region.

In an embodiment, light of an external light source may enter the lens assembly 210 of the camera module 180 via the display 160. For example, the light of the external light source may pass through the pixel layer 320 and the shielding structure 310 included in the display 160 and enter the lens assembly 210.

In an embodiment, if the electronic device 101 does not include the display 160, the light of the external light source may enter the lens assembly 210 via the shielding structure 310 formed in the camera hole (not shown).

Figure 4B:
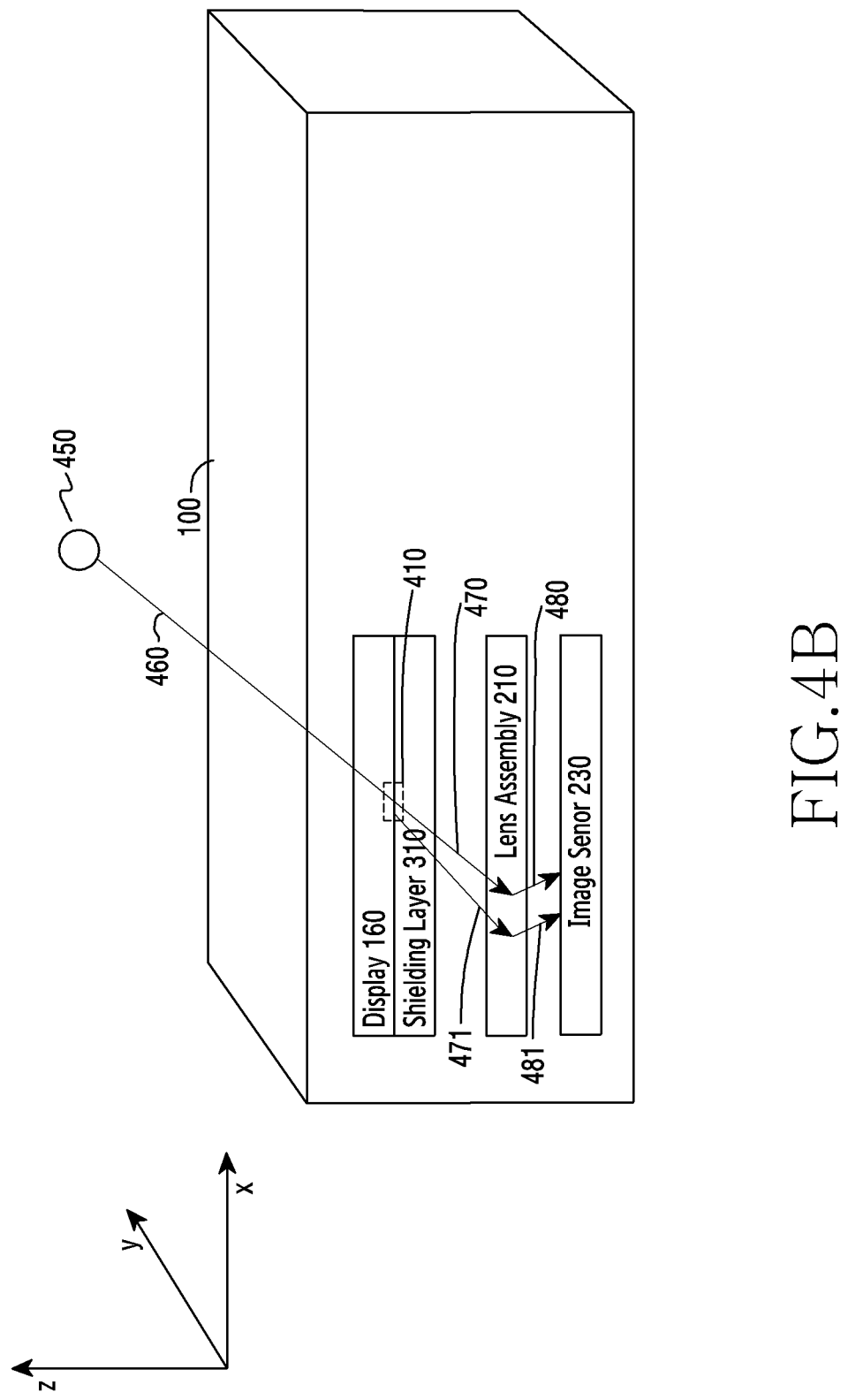
FIG. 4B is a diagram illustrating light from a subject directly reaching a lens of electronic device and light from the subject reaching the lens after diffraction, according to an embodiment.

FIG. 4B is a diagram illustrating light 460 from a subject 450 entering the hole 410 below the display 160. FIG. 4B is not a scaled drawing and is schematic in nature. Light (items 460, 470 and 480) from the subject 450 directly may reach the image sensor 230 through the lens assembly 210 of the electronic device 100. Also light (items 460, 471 and 481) from the subject 450 may reach the image sensor 230 through the lens assembly 210 after diffraction, according to an embodiment. In the non-limiting example of FIG. 4B, the electronic device 100 may have a thickness in a z direction and may extend in an x-y plane. In the non-limiting example of FIG. 4B, the display 160, the shielding layer 310, the lens assembly 210 and the image sensor 230 may functionally form a stack in the z direction, with each extending to varying extents in an x-y plane. In a non-limiting example, subject 450 may correspond to the external light source discussed with respect to FIGS. 6-8.

Figure 5:
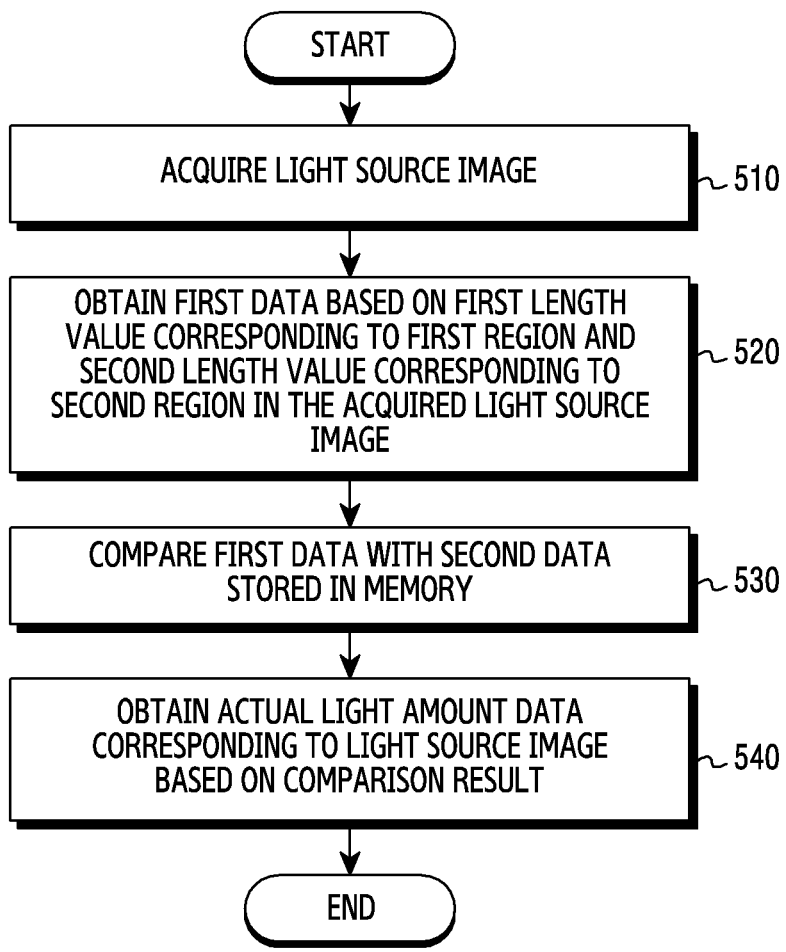
FIG. 5 is a diagram illustrating a flow for acquiring actual light amount data in an electronic device, according to an embodiment.

FIG. 5 is a diagram illustrating a logic flow for acquiring actual light amount data in an electronic device, according to an embodiment.

In an embodiment, in operation 510, the electronic device 101 may acquire a light source image. The electronic device 101 may acquire the light source image using the camera module 180 under control of the processor 120.

In an embodiment, the electronic device 101 may acquire an image (or the light source image) including the light source, under the control of the processor 120. For example, the electronic device 101 may acquire the image including a light source, a person, a background, and/or a thing.

In an embodiment, as the electronic device 101 acquires the light source image, the light of the light source may pass through the shielding structure (e.g., the shielding structure 310 of FIG. 4A) included in the electronic device 101. In an embodiment, the camera module 180 of the electronic device 101 may obtain the light of the light source passing through the shielding structure (e.g., the shielding structure 310 of FIG. 4A). For example, the light of the light source passing through the shielding structure (e.g., the shielding structure 310 of FIG. 4A) may include diffracted light.

In an embodiment, in operation 520, the electronic device 101 may obtain first data based on a first length value corresponding to a first region and a second length value corresponding to a second region in the acquired light source image.

In an embodiment, the electronic device 101 may divide the acquired light source image into regions under the control of the processor 120. For example, the acquired light source image may be an image based on the diffracted light, and the image based on the diffracted light may be divided into the first region which is a center region, and the second region which is a diffraction region.

In an embodiment, the electronic device 101 may obtain the length values, with respect to the light source image divided into the first region and the second region under the control of the processor 120. For example, the length value of the first region which is the center region may be a diameter value of the first region which is the center region, and the length value of the second region which is the diffraction region may be a value corresponding to a length of the diffraction region. The electronic device 101 may obtain the length value (or a first length value) of the first region and the length value (or a second length value) of the second region, under the control of the processor 120.

In an embodiment, the electronic device 101 may obtain first data based on the first length value and the second length value, under the control of the processor 120. For example, the first data may be ratio data of the first length value and the second length value. As another example, the first data may be ratio data related to the diameter value of the first region and the value corresponding to the length of the second region.

In an embodiment, in operation 530, the electronic device 101 may compare the first data with second data stored in the memory.

In an embodiment, under the control of the processor 120, the electronic device 101 may compare the obtained first data with the second data stored in the memory. The second data may be, for example, ratio data related to the diameter value of the first region and the value corresponding to the length of the second region, and may be ratio data according to characteristics of the light source prestored in the memory. Under the control of the processor 120, the electronic device 101 may compare the obtained first data with the second data which is the ratio data according to the characteristics of the light source prestored in the memory.

In an embodiment, the characteristics of the light source may include an intensity of light, and/or a light amount.

In an embodiment, in operation 540, the electronic device 101 may obtain actual light amount data corresponding to the light source image based on a comparison result.

In an embodiment, under the control of the processor 120, the electronic device 101 may identify the second data matching the first data by comparing the first data and the second data, and identify relevant light characteristics by identifying the second data. For example, under the control of the processor 120, the electronic device 101 may identify the second data, identify the intensity of light, and/or the light amount associated with the second data, and thus obtain the actual light amount data corresponding to the acquired light source image.

In an embodiment, depending on the shape and/or the size of the hole 410 of the shielding structure 310, the external light (the light source) entering the camera module 180 may be diffracted or scattered, and distortion or image quality degradation of the image data (the light source image data) may occur according to characteristics of line spread function (LSF), or point spread function (PSF). Under the control of the processor 120, the electronic device 101 may generate an image with the distortion or the image quality degradation corrected, by reflecting the actual light amount data in the image data acquired at the camera module 180.

More detailed descriptions on the operations for acquiring the actual light amount data of the electronic device 101 described with reference to FIG. 5 shall explain FIG. 6 through FIG. 8 related to the light diffraction, and shall describe more detail in FIG. 9 based on explanations of FIG. 6 through FIG. 8.

Figure 6:
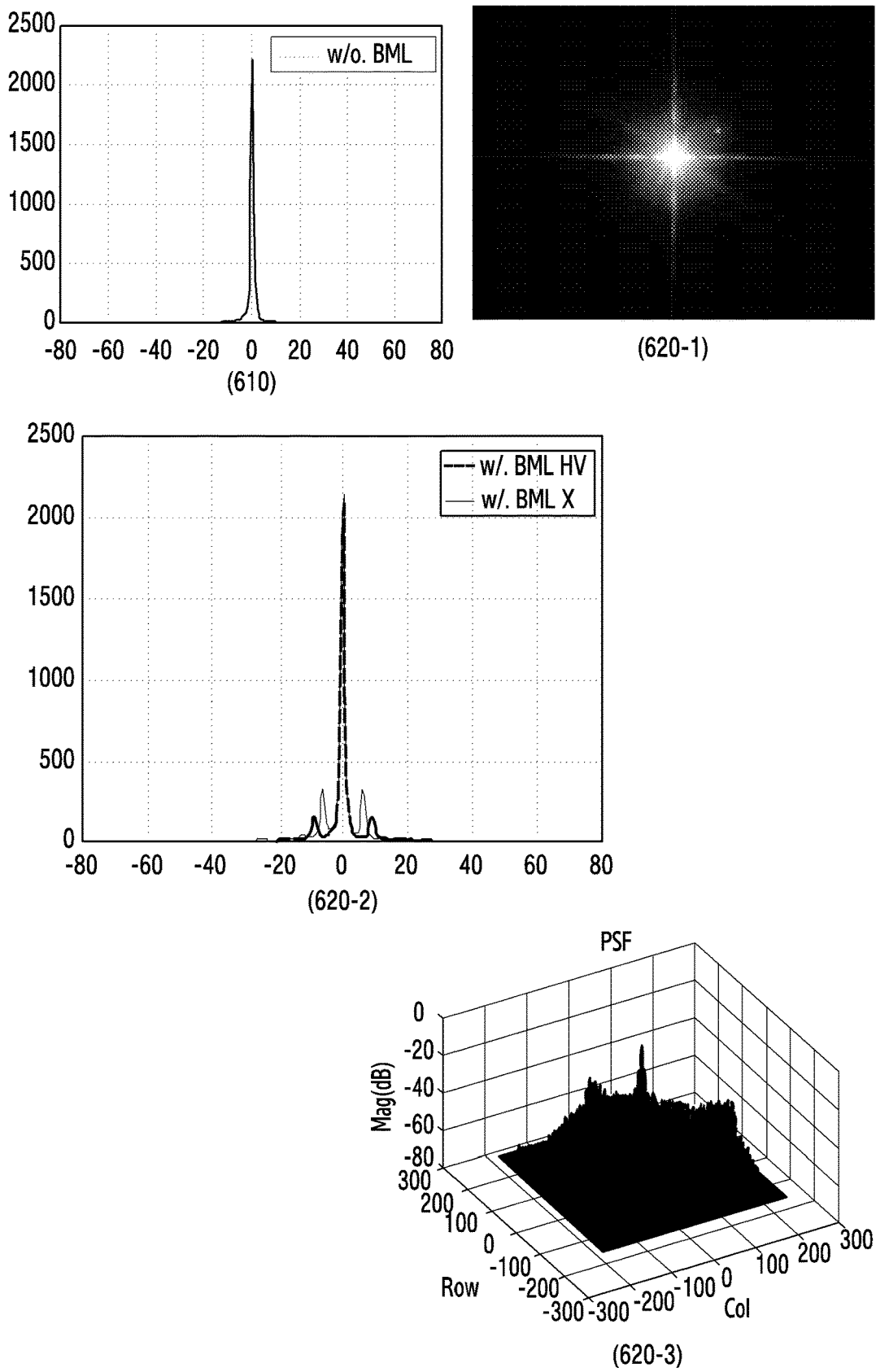
FIG. 6 is a diagram illustrating diffraction of light according to presence or absence of a shielding structure in an electronic device, according to an embodiment.

FIG. 6 is a diagram illustrating diffraction of light according to presence or absence of a shielding structure in an electronic device, according to an embodiment.

According to an embodiment, if the electronic device (e.g., the electronic device 101 of FIG. 1 and FIG. 3) has the shielding structure (e.g., the shielding structure 310 of FIG. 4A), the light of the light source entering the electronic device (e.g., the electronic device 101) may be diffracted. In an embodiment, if the light of the external light source of the electronic device 101 passes through the shielding structure 310, the camera module 180 may receive the light diffracted by the shielding structure 310.

In an embodiment, 610 shows an LSF graph if the electronic device 101 does not have the shielding structure 310. For example, if the light of the external light source does not pass the shielding structure 310 but enters the camera module 180, the LSF graph form without the diffraction as shown in 610 may exhibit.

In an embodiment, 620-1 shows the light source image if the electronic device 101 has the shielding structure 310. For example, the light source image if the light of the externa light source passes the shielding structure 310 and enters the camera module 180, may include a center region of the light source and a diffraction region of the light source as shown in 620-1. The center region of the light source may be a circular shape, and the diffraction region of the light source may include a linear shape protruding from the circular shape.

In an embodiment, 620-2 shows the LSF graph if the electronic device 101 has the shielding structure 310. For example, if the light of the external light source passes the shielding structure 310 and enters the camera module 180, the LSF graph form with the diffraction may exhibit as shown in 620-2.

In an embodiment, 620-3 shows a PSF graph if the electronic device 101 has the shielding structure 310. For example, if the light of the external light source passes the shielding structure 310 and enters the camera module 180, the PSF graph form with the diffraction may exhibit as shown in 620-3.

In an embodiment, the LSF or the PSF of the lens (e.g., the lens of the lens assembly 210 of FIG. 2) may create an image up to a diffraction limit which is an Airy disk, and a position of a dark pattern in the image may be expressed as the following [Equation 1].

$$Z = 1.22 \frac{\lambda}{d} \quad \text{[Equation 1]}$$

d: diameter of aperture
Z: dark pattern creation position
λ: wavelength

As shown in [Equation 1], the diffraction limit may occur, in inverse proportion to the diameter of the aperture. For example, if the electronic device 101 has the shielding structure 310, diffraction characteristics may be determined depending on a length of a vertical/horizontal direction and/or a diagonal direction of the hole (e.g., the hole 410 of FIG. 4A) of the shielding structure 310. In an embodiment, the hole 410 of the shielding structure 310 of the electronic device 101 may be a configuration corresponding to the aperture of [Equation 1].

Referring to FIG. 6, whether the diffraction occurs and the LSF and PSF graph outlines related to the diffraction in the light of the light source if the electronic device 101 has or does not have the shielding structure 310 have been described.

Figure 7:
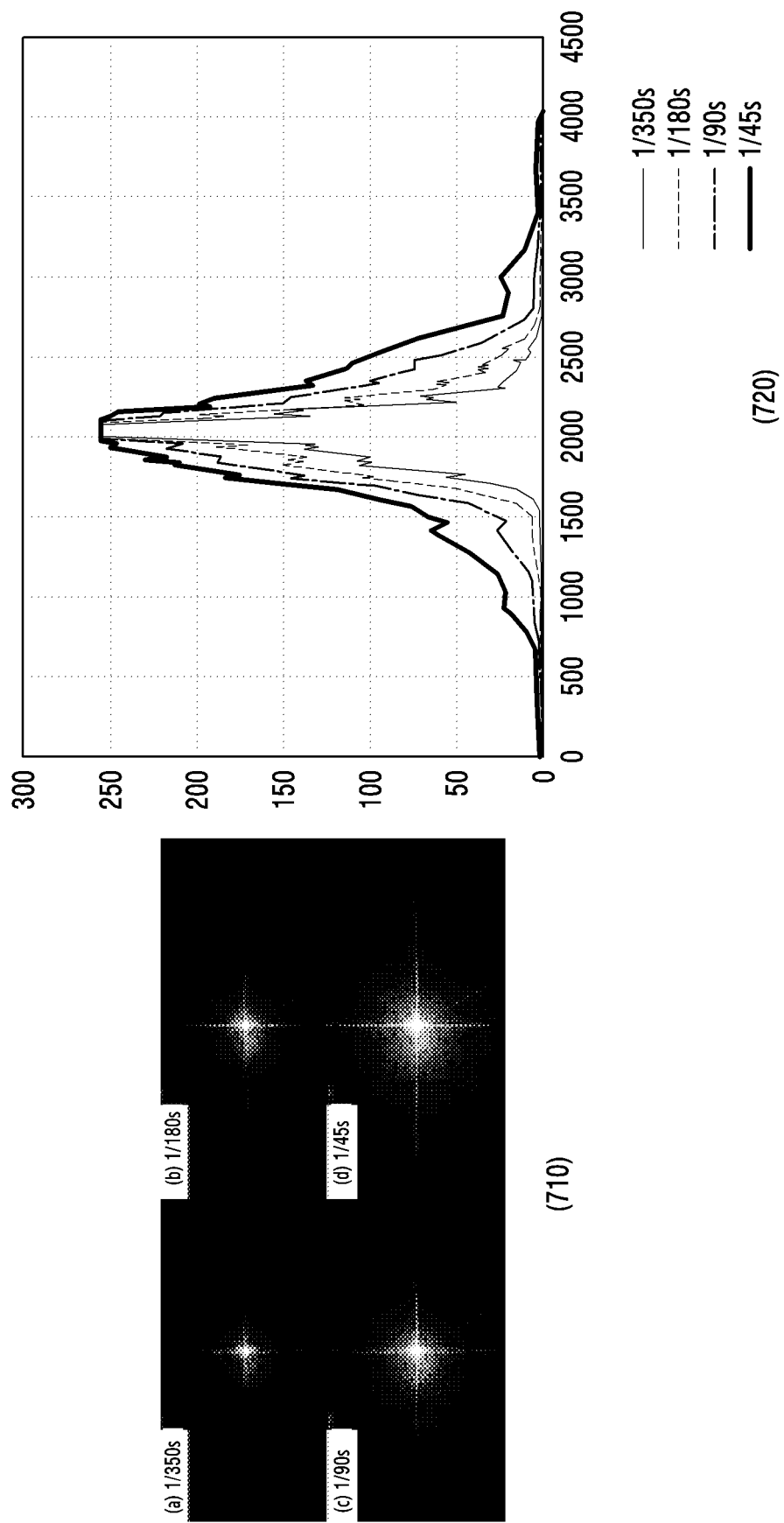
FIG. 7 is a diagram illustrating diffraction of light according to a shutter speed in an electronic device including a shielding structure, according to an embodiment.
Figure 8:
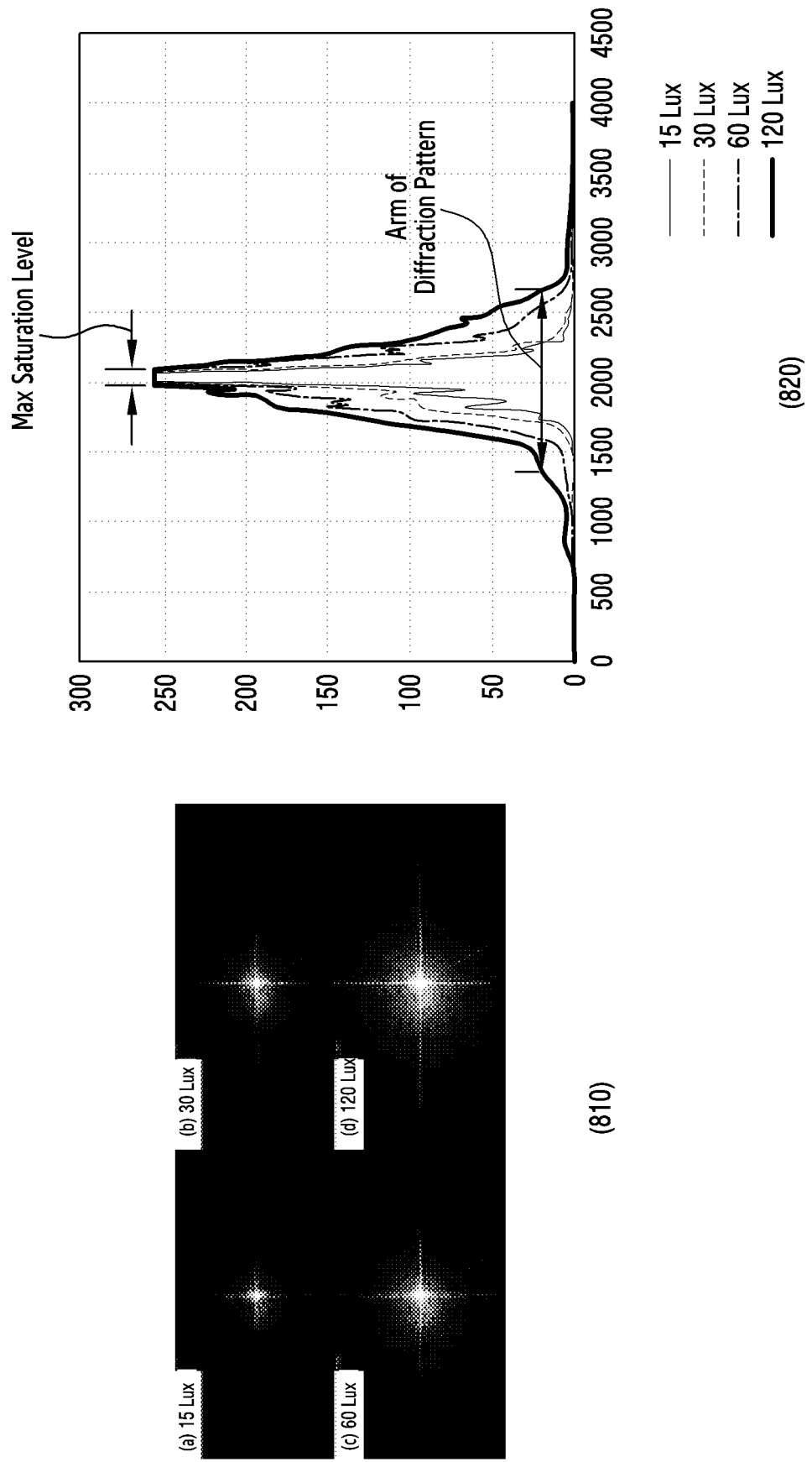
FIG. 8 is a diagram illustrating diffraction of light according to brightness of a light source in an electronic device including a shielding structure, according to an embodiment.

Hereafter, a diffraction level based on a shutter speed and/or brightness of the light source if the electronic device 101 has the shielding structure 310 shall be described by referring to FIG. 7 through FIG. 8.

FIG. 7 is a diagram illustrating diffraction of light according to a shutter speed in an electronic device including a shielding structure, according to an embodiment. In the LSF graph outline, greater spreading of the graph form in both directions based on the center may indicate a greater diffraction level.

In an embodiment, the light source image if the light of the externa light source passes the shielding structure 310 and enters the camera module 180, may include the center region of the light source and the diffraction region of the light source. The center region of the light source may be a circular form, and the diffraction region of the light source may include a linear form protruding from the circular form.

In an embodiment, 710 shows the light source images if the electronic device 101 has the shielding structure 310. In an embodiment, 710-(a) may be the light source image if the shutter speed is 1/350 second, 710-(b) may be the light source image if the shutter speed is 1/180 second, 710-(c) may be the light source image if the shutter speed is 1/90 second, and 710-(d) may be the light source image if the shutter speed is 1/45 second.

In an embodiment, as the shutter speed gets slow (longer duration, 1/45 is longer than 1/350), more light may enter the camera module 180 of the electronic device 101. For example, a greater light amount may enter the camera module 180 of the electronic device 101 at the shutter speed 1/45 second as shown in 740-(d) than 1/350 second as shown in 710-(a), and thus the diffraction level of the light and the saturation level of the light may more increase.

In an embodiment, referring to FIG. 710, as the light amount entering the camera module 180 of the electronic device 101 increases, it may be identified that the diffraction level of the light increases in the light source image. For example, the light amount entering the camera module 180 may increase along 710-(a), 710-(b), 710-(c), and 710-(d), and accordingly the diffraction level of the light may increase.

In an embodiment, 720 shows the LSF graph outline indicating the light diffraction level of the light source based on the shutter speed. The LSF graph form having the greater spreading in both directions based on the center may indicate the greater diffraction level of the light.

In an embodiment, as the shutter speed gets slow, it may be identified that the spreading of the LSF graph form in both directions based on the center increases. In an embodiment, the LSF graph form may spread more in both directions based on the center at 1/180 second than the shutter speed 1/350 second. In an embodiment, the LSF graph form may spread more in both directions based on the center at 1/90 second than the shutter speed 1/180 second. In an embodiment, the LSF graph form may spread more in both directions based on the center at 1/45 second than the shutter speed 1/90 second.

FIG. 8 is a diagram illustrating diffraction of light according to brightness of a light source in an electronic device including a shielding structure, according to an embodiment.

In an embodiment, referring to 810, 810-(a) through 810-(d) show the light source image based on the brightness of the light source.

In an embodiment, 820 shows the LSF graph outline based on the brightness of the light source. In an embodiment, referring to 810, In the LSF graph outline, greater spreading of the graph form in both directions based on the center may indicate a greater arm of diffraction. In addition, a longer interval where the maximum level is maintained in the LSF graph outline may indicate a greater saturation region of light (max saturation level).

In an embodiment, the light source image if the light of the externa light source passes the shielding structure 310 and enters the camera module 180, may include the center region of the light source and the diffraction region of the light source. The center region of the light source may be a circular form, and the diffraction region of the light source may include a linear form protruding from the circular form.

In an embodiment, 810 shows the light source image if the electronic device 101 has the shielding structure 310. In an embodiment, 810-(a) may be the light source image if the brightness of the light source is 15 lux, 810-(b) may be the light source image if the brightness of the light source is 30 lux, 810-(*c*) may be the light source image if the brightness of the light source is 60 lux, and 810-(*d*) may be the light source image if the brightness of the light source is 120 lux.

In an embodiment, as the brightness of the light source increases, the diffraction level of the light and the saturation level of the light entering the camera module 180 of the electronic device 101 may increase more.

In an embodiment, referring to 810, as the brightness of the light source entering the camera module 180 of the electronic device 101 increases, it may be identified that the diffraction level of the light increases in the light source image. For example, the brightness of the light entering the camera module 180 may increase along 810-(*a*), 810-(*b*), 810-(*c*), and 810-(*d*), and accordingly the diffraction level of the light may increase.

In an embodiment, 820 shows the LSF graph outline indicating the light diffraction level of the light source based on the brightness of the light source. The LSF graph form having the greater spreading in both directions based on the center may indicate the greater diffraction level of the light (or the saturation region of the light).

In an embodiment, as the brightness of the light source increases, it may be identified that the spreading of the LSF graph form in both directions based on the center increases. In an embodiment, the LSF graph form may spread more in both directions based on the center if the brightness of the light source is 30 lux than 15 lux. In an embodiment, the LSF graph form may spread more in both directions based on the center if the brightness of the light source is 60 lux than 30 lux. In an embodiment, the LSF graph form may spread more in both directions based on the center if the brightness of the light source is 120 lux than 60 lux.

In an embodiment, the diffraction level occurring if the light of the light source passes the shielding structure (e.g., the shielding structure 310), as described in reference to FIG. 7 through FIG. 8, may follow the following [Equation 2].

$$I_1(\theta, a) = I_o\left(\frac{2J_1(ka\ \sin\theta)}{ka\ \sin\theta}\right)^2 \quad \text{[Equation 2]}$$

In [Equation 2], $I_0$ may denote the brightness of the incident light, $I_1$ may denote the diffraction level, a may denote an aperture radius, θ may denote an incident angle, $J_1$ may denote a Bessel function, k may denote $2\pi/\lambda$, and λ may denote a wavelength.

In an embodiment, the diffraction level is proportional to intensity of the incident light, and inversely proportional to the aperture radius. In an embodiment, if a light source size is practically close to infinitesimal (or if it is a point light source), a ratio of the diffraction level of the light source, and the linear diffraction level according to the light amount (e.g., the light amount based on the shutter speed, the actual light amount of the light) may be constant.

In an embodiment, the hole (e.g., the hole 410 of FIG. 4A) of the shielding structure (e.g., the shielding structure 310) of the electronic device (e.g., the electronic device 101) may be the configuration corresponding to the aperture of [Equation 2].

In an embodiment, even in the diffraction of substantially the same light brightness, the horizontal direction and the vertical direction of the shielding structure (e.g., the shielding structure 310) has a smaller effective aperture (or hole) than the diagonal direction and accordingly may exhibit the linear diffraction region.

In an embodiment, the length of the linear diffraction region of the diffraction light may differ depending on the length of the horizontal direction, the vertical direction, or the diagonal direction of the shielding structure (e.g., the shielding structure 310), but the ratio of the diffraction based on [Equation 2] may be the same.

In an embodiment, if assuming an ideal point light source, the ratio of the diameter value of the center region (e.g., the first region) of the diffraction light and the length value of the diffraction region (e.g., the second region) of the diffraction light may be maintained constantly regardless of the intensity of light.

In an embodiment, if assuming an ideal point light source, the length value of the diffraction region (e.g., the second region) of the diffraction light may increase as the intensity of the light increases.

In an embodiment, in the light source entering the camera module (e.g., the camera module 180) of the electronic device (e.g., the electronic device 101), the light source may be a light source corresponding to a surface light source having a specific size rather than the ideal point light source. In this case, even though the length value of the diffraction region (e.g., the second region) of the diffraction light is substantially the same, actual brightness of the light source may differ. In addition, the ratio of the diameter value of the center region (e.g., the first region) of the diffraction light and the length value of the diffraction region (e.g., the second region) of the diffraction light may differ depending on the intensity of the light, unlike the point light source.

Hereafter, based on the descriptions in reference to FIG. 1 through FIG. 8, a specific flow of obtaining actual light amount data by acquiring correction data in an electronic device according to an embodiment is explained.

Figure 9:
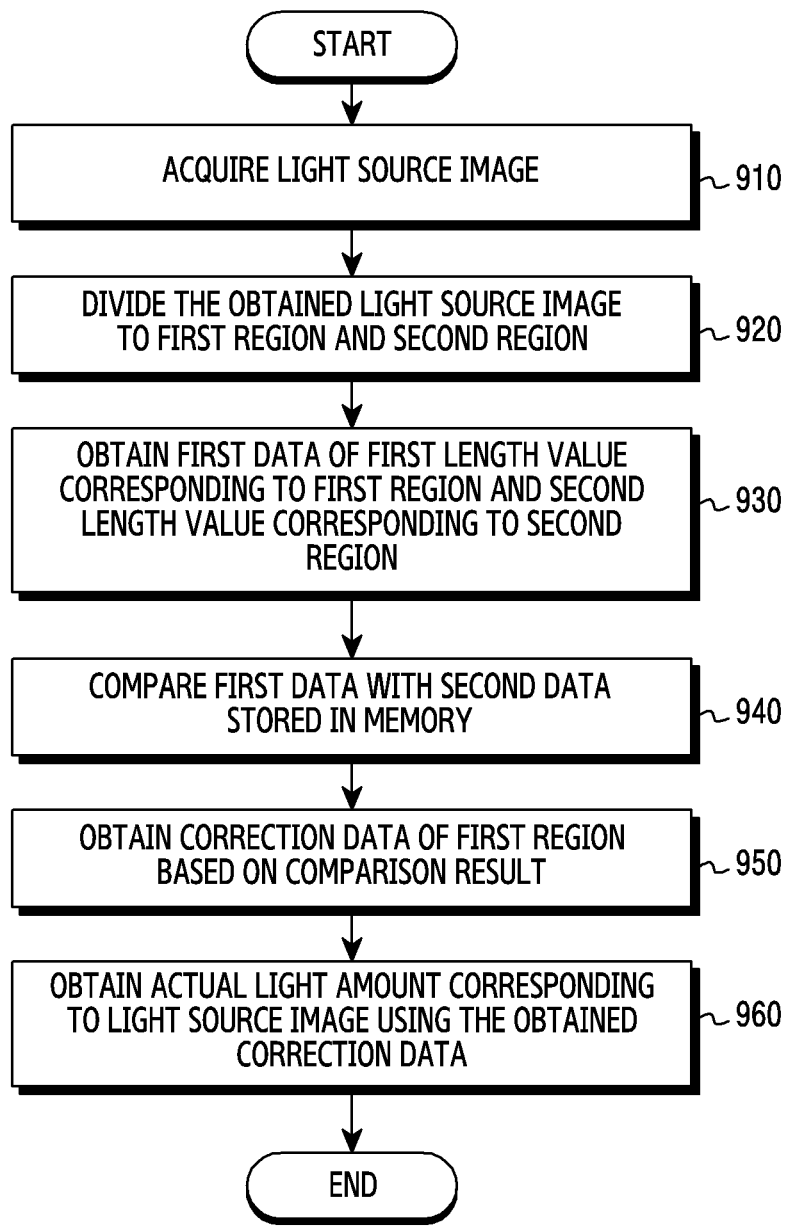
FIG. 9 is a diagram illustrating a detailed flow for acquiring actual light amount data in an electronic device, according to an embodiment.

FIG. 9 is a diagram illustrating a detailed flow for acquiring actual light amount data in an electronic device, according to an embodiment.

Figure 10:
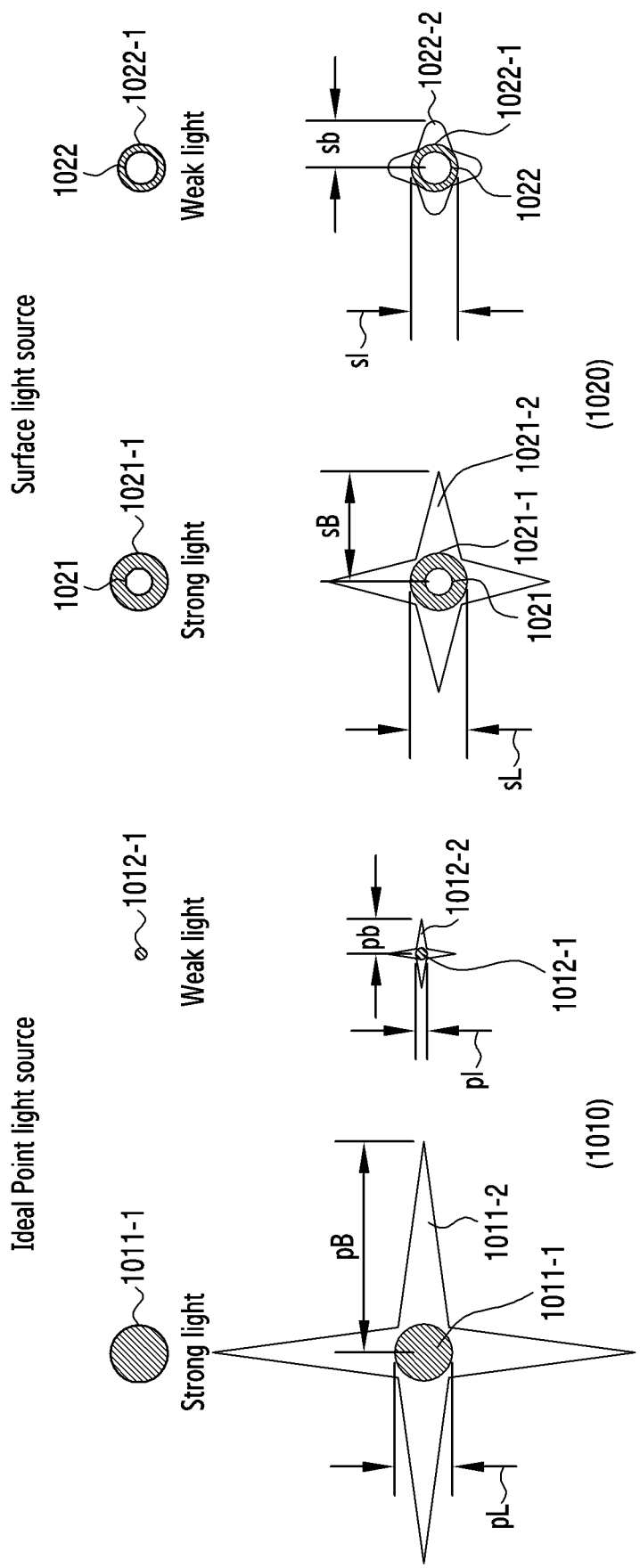
FIG. 10 is a diagram illustrating difference of a point light source and a surface light source, according to an embodiment.
Figure 11:
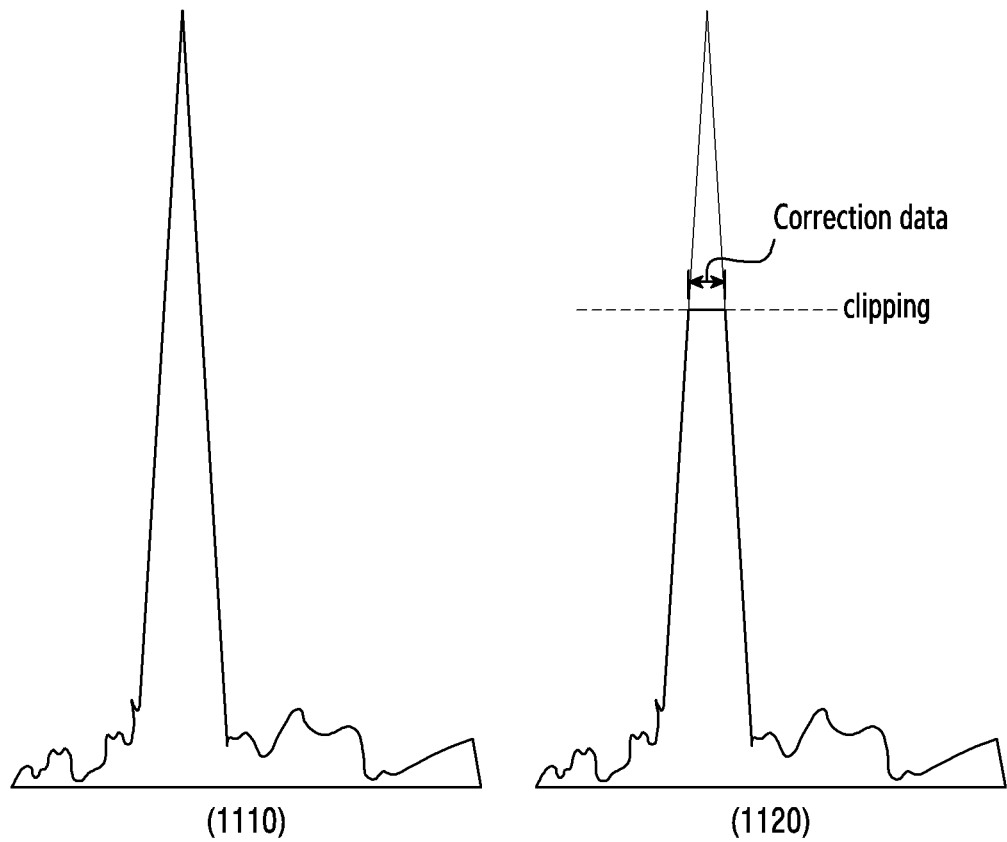
FIG. 11 is a diagram illustrating a concept of acquiring actual light amount data corresponding to a light source image using correction data acquired by an electronic device, according to an embodiment.

The flow of FIG. 9 is described by referring to FIG. 10 which shows difference of a point light source and a surface light source, and FIG. 11 which shows a concept of acquiring actual light amount data corresponding to a light source image using correction data obtained by an electronic device.

According to an embodiment, in operation 910, the electronic device 101 may obtain a light source image.

In an embodiment, the electronic device 101 may obtain the light source image using the camera module 180 under the control of the processor 120. In an embodiment, the electronic device 101 may obtain an image including the light source (or the light source image), under the control of the processor 120. For example, the electronic device 101 may obtain an image including a light source, a person, a background, and/or a thing. In an embodiment, as the electronic device 101 obtains the light source image, the light of the light source may pass the shielding structure (e.g., the shielding structure 310 of FIG. 4A) included in the electronic device 101. In an embodiment, the camera module 180 of the electronic device 101 may obtain the light of the light source passing the shielding structure (e.g., the shielding structure 310 of FIG. 4A). For example, the light of the light source passing the shielding structure (e.g., the shielding structure 310 of FIG. 4A) may include the diffracted light.

In an embodiment, referring to FIG. 10, if the diffracted light passing the shielding structure (e.g., the shielding structure 310) is an ideal point light source, it may include a form as shown in 1010. In an embodiment, if the diffracted light passing the shielding structure (e.g., the shielding structure 310) is a surface light source, it may include a form as shown in 1020.

According to an embodiment, in operation 920, the electronic device 101 may divide the obtained light source image to the first region and the second region.

In an embodiment, the electronic device 101 may divide the light source image to the first region which is the center region of the light source and the second region which is the diffraction region under the control of the processor 120.

In an embodiment, the electronic device 101 may divide a center region 1011-1 of a light source (e.g., a strong point light source) to the first region, and a diffraction region 1011-2 of the light source (e.g., a strong point light source) to the second region under the control of the processor 120. In an embodiment, the electronic device 101 may divide a center region 1012-1 of a light source (e.g., a weak point light source) to the first region, and a diffraction region 1012-2 of the light source (e.g., a weak point light source) to the second region under the control of the processor 120. In an embodiment, the electronic device 101 may divide a center region 1021-1 of a light source (e.g., a strong surface light source) to the first region, and a diffraction region 1021-2 of the light source (e.g., a strong surface light source) to the second region under the control of the processor 120. In an embodiment, the electronic device 101 may divide a center region 1022-1 of a light source (e.g., a weak surface light source) to the first region, and a diffraction region 1022-2 of the light source (e.g., a weak surface light source) to the second region under the control of the processor 120.

In an embodiment, the electronic device 101 may obtain a light amount corresponding to the first region, under the control of the processor 120. For example, the electronic device 101 may obtain the light amount corresponding to the first region (e.g., 1011-1, 1012-1, 1021-1, 1022-1) under the control of the processor 120.

According to an embodiment, in operation 930, the electronic device 101 may obtain first data related to a first length value corresponding to the first region and a second length value corresponding to the second region.

In an embodiment, referring to FIG. 1020, the electronic device 101 may obtain a first length value sL corresponding to the first region which is the center region 1021-1 of the light source (e.g., a strong surface light source) under the control of the processor 120. For example, the electronic device 101 may obtain a diameter value of the first region (e.g., a center region) as the first length value sL under the control of the processor 120. In an embodiment, the electronic device 101 may obtain a second length value sB in the second region which is a diffraction region 1021-2 of the light source (e.g., a strong surface light source) under the control of the processor 120. For example, the electronic device 101 may obtain a length value of the second region (e.g., a diffraction region) as the second length value sB under the control of the processor 120.

In an embodiment, identically or similarly to the strong surface light source, even for the weak surface light source, the electronic device 101 may obtain a first length value sl corresponding to the first region which is the center region 1022-1 under the control of the processor 120. It may obtain a second length value sb in the second region which is a diffraction region 1022-2 under the control of the processor 120.

In an embodiment, the electronic device 101 may obtain the first data which is the data related to the ratio of the first length value and the second length value obtained, under the control of the processor 120. For example, in case of the strong surface light source, the electronic device 101 may obtain a value of sB/sL under the control of the processor 120. In addition, in case of the weak surface light source, the electronic device 101 may obtain a value of sb/sl under the control of the processor 120.

In an embodiment, as the intensity of the light source increases or the brightness of the light increases in the surface light source, the value of the first data may increase. For example, the first data may satisfy a relational expression of sB/sL>sb/sl. Specifically, for example, the value of the first data sB/sL of the strong surface light source may be greater than the value of the first data sb/sl of the weak surface light source.

According to an embodiment, in operation 940, the electronic device 101 may compare the first data with second data stored in the memory.

In an embodiment, the second data stored in the memory 130 of the electronic device 101 may be the ratio data in case of the ideal point light source. For example, the electronic device 101 may store the ratio data in case of the ideal point light source. Specifically, for example, the memory 130 of the electronic device 101 may store values of the second data (e.g., pL/pB) which is the ratio data of the first length value pL corresponding to the first region (e.g., the center region) and the second length value pB corresponding to the second region (e.g., the diffraction region). As another example, the memory 130 of the electronic device 101 may store values of the second data (e.g., pl/pb) which is the ratio data corresponding to the first length value pl and the second length value pb in case of the weak point light source.

In an embodiment, the ideal point light source may satisfy a relational expression of pB/pL=pb/pl. For example, the ratio of the diameter value of the center region (e.g., the first region) of the diffraction light and the length value of the diffraction region (e.g., the second region) of the diffraction light may be constantly maintained regardless of the intensity of the light or the light amount. As a specific example, the ratio data pL/pB of the first length value pL corresponding to the first region 1011-1 and the second length value pB corresponding to the second region 1011-2 of the strong point light source may be constant. In addition, the ratio data pl/pb of the first length value pl corresponding to the first region 1012-1 and the second length value pb corresponding to the second region 1012-2 of the weak point light source may be constant.

In an embodiment, the electronic device 101 may compare the obtained first data with the second data which is the ratio data according to the characteristics of the light source prestored in the memory, under the control of the processor 120. For example, in case of the strong light source, the electronic device 101 may compare the obtained first data (e.g., sL/sB) with the second data (e.g., pL/pB) stored in the memory 130 under the control of the processor 120. As another example, in case of the weak light source, the electronic device 101 may compare the obtained first data (e.g., sl/sb) with the second data (e.g., pl/pb) stored in the memory 130 under the control of the processor 120.

In an embodiment, in operation 950, the electronic device 101 may obtain correction data of the first region based on a comparison result.

In an embodiment, under the control of the processor 120, the electronic device 101 may identify the second data matching the first data by comparing the first data and the second data, and identify relevant light characteristics (e.g., a light source type, a light source size) by identifying the second data.

In an embodiment, the electronic device 101 may estimate whether it is the surface light source or not and the size of the surface light source, by comparing the second data stored in the memory 130 with the first data. For example, in case of the strong surface light source, under the control of the processor 120, the electronic device 101 may compare the first data (e.g., sL/sB) and the second data (e.g., pL/pB) stored in the memory 130, and identify the corresponding light source as the surface light source if there is a difference as a result of the comparison. As another example, in case of the weak surface light source, under the control of the processor 120, the electronic device 101 may compare the first data (e.g., sl/sb) and the second data (e.g., pl/pb) stored in the memory 130, and identify the corresponding light source as the surface light source if the compared data values are different.

In an embodiment, the electronic device 101 may estimate the size of the surface light source based on the difference of the compared data values under the control of the processor 120. For example, the electronic device 101 may identify the difference by comparing the first data (e.g., sL/sB) and the second data (e.g., pL/pB) based on the control of the processor 120, and estimate the size (e.g., 1021) of the surface light source based on the difference. In addition, under the control of the processor 120, the electronic device 101 may estimate that the size of the surface light source is great as the difference increases, and that the size of the surface light source is small as the difference decreases. As another example, under the control of the processor 120, the electronic device 101 may identify the difference by comparing the first data (e.g., sl/sb) and the second data (e.g., pl/pb), and estimate the size (e.g., 1022) of the surface light source based on the difference. Also, under the control of the processor 120, the electronic device 101 may estimate that the size of the surface light source is great as the difference increases, and that the size of the surface light source is small as the difference decreases.

In an embodiment, the electronic device 101 may use the estimated size (e.g., 1021, 1022) of the surface light source as the correction data for obtaining the actual light amount data. For example, the electronic device 101 may estimate the size (e.g., 1021, 1022) of the surface light source by comparing the data (e.g., the second data) of the ideal point light source) with the data (e.g., the first data) of the surface light source under the control of the processor 120, and utilize it as the correction data for calculating the actual light amount.

According to an embodiment, in operation 960, the electronic device 101 may obtain the actual light amount corresponding to the light source image using the obtained correction data.

In an embodiment, under the control of the processor 120, the electronic device 101 may obtain the correction data corresponding to the estimated size of the surface light source. For example, if the estimated size of the surface light source is great, a correction degree (or a correction amount) may be greater than the estimated small size of the surface light source. The electronic device 101 may obtain the correction data corresponding to the correction degree under the control of the processor 120.

In an embodiment, 1110 of FIG. 11 is an outline of the graph of the light amount corresponding to the first region (e.g., 1011-1, 1012-1, 1021-1, 1022-1) of the obtained correction data.

In an embodiment, 1120 of FIG. 11 is an outline of the graph reflecting the correction data in the light amount corresponding to the first region (e.g., 1011-1, 1012-1, 1021-1, 1022-1) of the obtained correction data.

In an embodiment, as shown in 1110 and 1120 of FIG. 11, the electronic device 101 may reflect the obtained correction data in the light amount corresponding to the first region (e.g., 1011-1, 1012-1, 1021-1, 1022-1), under the control of the processor 120. For example, the electronic device 101 may clip a light amount corresponding to the correction data from the light amount corresponding to the first region (e.g., 1011-1, 1012-1, 1021-1, 1022-1), based on the control of the processor 120.

In an embodiment, the electronic device 101 may obtain the actual light amount data, by clipping the light amount corresponding to the correction data from the light amount corresponding to the first region (e.g., 1011-1, 1012-1, 1021-1, 1022-1), under the control of the processor 120.

In an electronic device (e.g., the electronic device 101) according to an embodiment, the electronic device (e.g., the electronic device 101) may include a memory (e.g., the memory 130), a display which includes a pixel layer (e.g., the pixel layer 320) including a plurality of pixels and a shielding structure (e.g., the shielding structure 310) with a hole (e.g., the hole 410) formed disposed below the pixel layer (e.g., the pixel layer 320), a camera module (e.g., the camera module 180) disposed below the shielding structure (e.g., the shielding structure 310), and a processor (e.g., the processor 120) operatively coupled with the camera module (e.g., the camera module 180) and the memory (e.g., the memory 130), and the processor (e.g., the processor 120) may obtain a light source image through the camera module (e.g., the camera module 180), obtain a first data based on a first length value corresponding to a first region and a second length value corresponding to a second region in the obtained light source image, compare the first data with second data stored in the memory (e.g., the memory 130), and obtain actual light amount data corresponding to the light source based on a result of the comparison.

In the electronic device (e.g., the electronic device 101) according to an embodiment, the light source image may be an image of diffracted light.

In the electronic device (e.g., the electronic device 101) according to an embodiment, the first region may correspond to a center region of the light source image, and the second region may correspond to a diffraction region of the light source image.

In the electronic device (e.g., the electronic device 101) according to an embodiment, the first length value may correspond to a diameter value of the center region, and the second length value may correspond to a length value of the diffraction region.

In the electronic device (e.g., the electronic device 101) according to an embodiment, the first data may be ratio data of the first length value and the second length value.

In the electronic device (e.g., the electronic device 101) according to an embodiment, the second data may be ratio data of a point light source.

In the electronic device (e.g., the electronic device 101) according to an embodiment, the ratio data of the point light source may be constant regardless of a light amount.

In the electronic device (e.g., the electronic device 101) according to an embodiment, in performing the comparison, the processor (e.g., the processor 120) may identify the second data matching the first data.

In the electronic device (e.g., the electronic device 101) according to an embodiment, in performing the comparison, the processor (e.g., the processor 120) may identify characteristics of light associated with the identified second data.

In an operating method of an electronic device (e.g., the electronic device 101) according to an embodiment, the operating method may include obtaining a light source image through a camera module (e.g., the camera module 180) disposed below a shielding structure (e.g., the shielding structure 310), obtaining a first data based on a first length value corresponding to a first region and a second length value corresponding to a second region in the obtained light source image, comparing the first data with second data stored in a memory (e.g., the memory 130), and obtaining actual light amount data corresponding to the light source based on a result of the comparison.

In the operating method of the electronic device (e.g., the electronic device 101) according to an embodiment, the first region may correspond to a center region of the light source image, and the second region may correspond to a diffraction region of the light source image.

In the operating method of the electronic device (e.g., the electronic device 101) according to an embodiment, the first length value may correspond to a diameter value of the center region, and the second length value may correspond to a length value of the diffraction region.

In the operating method of an electronic device (e.g., the electronic device 101) according to an embodiment, comparing may further include identifying the second data matching the first data In the operating method of the electronic device (e.g., the electronic device 101) according to an embodiment, comparing may further include identifying characteristics of light associated with the second data identified.

In the operating method of the electronic device (e.g., the electronic device 101) according to an embodiment, the first data may be ratio data of the first length value and the second length value.

In an electronic device (e.g., the electronic device 101) according to an embodiment, the electronic device (e.g., the electronic device 101) may include a memory (e.g., the memory 130), a camera hole (e.g., the hole 410) including a shielding structure (e.g., the shielding structure 310) which has a particular shape, a camera module (e.g., the camera module 180) disposed below the camera hole (e.g., the hole 410), and a processor (e.g., the processor 120) operatively coupled with the camera module (e.g., the camera module 180) and the memory (e.g., the memory 130), and the processor (e.g., the processor 120) may obtain a light source image through the camera module (e.g., the camera module 180), obtain a first data based on a first length value corresponding to a first region and a second length value corresponding to a second region in the obtained light source image, compare the first data with second data stored in the memory (e.g., the memory 130), and obtain actual light amount data corresponding to the light source based on a result of the comparison.

In the electronic device (e.g., the electronic device 101) according to an embodiment, the light source image may be an image of diffracted light.

In the electronic device (e.g., the electronic device 101) according to an embodiment, the first region may correspond to a center region of the light source image, and the second region may correspond to a diffraction region of the light source image.

In the electronic device (e.g., the electronic device 101) according to an embodiment, the first length value may correspond to a diameter value of the center region, and the second length value may correspond to a length value of the diffraction region.

In the electronic device (e.g., the electronic device 101) according to an embodiment, in performing the comparison, the processor (e.g., the processor 120) may identify the second data matching the first data, and identify characteristics of light associated with the second data identified.

The electronic device according to various embodiments described in the present disclosure may be a device of various types. The electronic device may include, for example, a portable communication device (e.g., a smart phone), a computer device, a portable multimedia device, a portable medical device, a camera, a wearable device, or a home appliance. The electronic device according to an embodiment of the present disclosure is not limited to those devices described above.

It should be appreciated that various embodiments of the present disclosure and the terms used therein are not intended to limit the technological features set forth in the present disclosure to particular embodiments, and include various changes, equivalents, or replacements of a corresponding embodiment. With regard to the descriptions of the drawings, similar reference numerals may be used to refer to similar or related elements. A singular form of a noun corresponding to an item may include one or more of the items, unless the relevant context clearly indicates otherwise. In the present disclosure, each of such phrases as "A or B," "at least one of A and B," "at least one of A or B," "A, B, or C," "at least one of A, B, and C," and "at least one of A, B, or C," may include any one or all possible combinations of the items enumerated together with a corresponding one of the phrases. Such terms as "1st" and "2nd," or "first" and "second" may be used to simply distinguish a corresponding component from another component, and do not limit the components in other aspect (e.g., importance or order). If an element (e.g., a first element) is referred to, with or without the term "operatively" or "communicatively", as "coupled" or "connected" to another element (e.g., a second element), it means that the element may be coupled with the other element directly (e.g., wiredly), wirelessly, or via a third element.

The term "module" used in various embodiments of the present disclosure may include a unit implemented in hardware, software or firmware, and may be interchangeably used with other term, for example, logic, a logic block, a part, or circuitry. The module may be a single integral component, or a minimum unit or part thereof, for performing one or more functions. For example, according to an embodiment, the module may be implemented in a form of an application-specific integrated circuit (ASIC).

Various embodiments of the present disclosure may be implemented as software (e.g., the program 140) including one or more instructions which are stored in a storage medium (e.g., the internal memory 136 or the external memory 138) readable by a machine (e.g., the electronic device 101). For example, a processor (e.g., the processor 120) of the machine (e.g., the electronic device 101) may invoke at least one of the one or more instructions stored in the storage medium, and execute it or them. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Herein, 'non-transitory' simply means that the storage medium is a tangible device, and does not include a signal (e.g., an electromagnetic wave), but this term does not differentiate between a case where data is semi-permanently stored in the storage medium and a case where the data is temporarily stored.

According to an embodiment, a method according to various embodiments of the present disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) directly or online via an application store (e.g., Play Store™), or between two user devices (e.g., smart phones). If distributed online, at least part of the computer program product may be temporarily stored in the machine-readable storage medium such as a memory of a manufacturer's server, a server of the application store, or a relay server, or may be temporarily generated.

According to various embodiments, each component (e.g., a module or a program) of the above-described components may include a single entity or multiple entities, and some of the multiple entities may be separately deployed in different components. According to various embodiments, one or more component or operations of the above-described components may be omitted, or one or more other components or operations may be added. Alternatively or additionally, a plurality of components (e.g., modules or programs) may be integrated as a single component. In this case, the integrated component may perform one or more functions of each component of the plurality of components in the same or similar manner as they are performed by a corresponding component of the plurality of components before the integration. According to various embodiments, operations performed by the module, the program, or other component may be carried out sequentially, in parallel, repeatedly, or heuristically, or one or more of the operations may be executed in a different order or omitted, or one or more other operations may be added.

The invention claimed is:

1. An electronic device comprising:
   a memory;
   a display comprising:
      a pixel layer comprising a plurality of pixels, and
      a shielding structure with a hole formed disposed below the pixel layer;
   a camera module disposed below the shielding structure; and
   a processor operatively coupled with the camera module and the memory,
   wherein the processor is configured to:
      obtain a light source image through the camera module,
      obtain first data based on a first length value corresponding to a first region and a second length value corresponding to a second region in the light source image,
      perform a comparison of the first data with second data stored in the memory,
      obtain actual light amount data corresponding to a light source based on a result of the comparison, and
      improve a final image using the actual light amount data.

2. The electronic device of claim 1, wherein the light source image is an image of diffracted light.

3. The electronic device of claim 1, wherein the first region corresponds to a center region of the light source image, and the second region corresponds to a diffraction region of the light source image.

4. The electronic device of claim 3, wherein the first length value corresponds to a diameter value of the center region, and
   the second length value corresponds to a length value of the diffraction region.

5. The electronic device of claim 1, wherein the first data is ratio data of the first length value and the second length value.

6. The electronic device of claim 1, wherein the second data is ratio data of a point light source.

7. The electronic device of claim 6, wherein the ratio data of the point light source is constant regardless of a light amount.

8. The electronic device of claim 1, wherein the processor is further configured to perform the comparison by identifying the second data matching the first data.

9. The electronic device of claim 8, wherein the processor is further configured to perform the comparison by identifying characteristics of light associated with the identified second data.

10. A method of an electronic device, the method comprising:
    obtaining a light source image through a camera module disposed below a shielding structure;
    obtaining a first data based on a first length value corresponding to a first region and a second length value corresponding to a second region in the light source image;
    performing a comparison of the first data with second data stored in a memory;
    obtaining actual light amount data corresponding to a light source based on a result of the comparison; and
    improving a final image using the actual light amount data.

11. The method of claim 10, wherein the first region corresponds to a center region of the light source image, and the second region corresponds to a diffraction region of the light source image.

12. The method of claim 11, wherein the first length value corresponds to a diameter value of the center region, and the second length value corresponds to a length value of the diffraction region.

13. The method of claim 10, wherein comparing further comprises:
    identifying the second data matching the first data.

14. The method of claim 13, wherein comparing further comprises:
    identifying characteristics of light associated with the second data identified.

15. The method of claim 10, wherein the first data is ratio data of the first length value and the second length value.

16. An electronic device comprising:
    a memory;
    a camera hole comprising a shielding structure which has a particular shape;
    a camera module disposed below the camera hole; and
    a processor operatively coupled with the camera module and the memory,
    wherein the processor is configured to:
       obtain a light source image through the camera module,
       obtain first data based on a first length value corresponding to a first region and a second length value corresponding to a second region in the light source image, perform a comparison of the first data with second data stored in the memory, obtain actual light amount data corresponding to a light source based on a result of the comparison, wherein the light source is associated with the light source image, and improve a final image using the actual light amount data.

17. The electronic device of claim 16, wherein the light source image is an image of diffracted light.

18. The electronic device of claim 16, wherein the first region corresponds to a center region of the light source image, and the second region corresponds to a diffraction region of the light source image.

19. The electronic device of claim 18, wherein the first length value corresponds to a diameter value of the center region, and the second length value corresponds to a length value of the diffraction region.

20. The electronic device of claim 16, wherein, in performing the comparison, the processor identifies the second data matching the first data, and identifies characteristics of light associated with the second data identified.

* * * * *